United States Patent [19]

Aurichio

[11] Patent Number: 4,961,804
[45] Date of Patent: Oct. 9, 1990

[54] CARRIER FILM WITH CONDUCTIVE ADHESIVE FOR DICING OF SEMICONDUCTOR WAFERS AND DICING METHOD EMPLOYING SAME

[75] Inventor: Joseph A. Aurichio, Anderson, S.C.

[73] Assignee: Investment Holding Corporation, Wilmington, Del.

[21] Appl. No.: 840,461

[22] Filed: Mar. 6, 1986

Related U.S. Application Data

[63] Continuation of Ser. No. 697,424, Feb. 1, 1985, which is a continuation of Ser. No. 519,936, Aug. 3, 1983.

[51] Int. Cl.$^5$ .............................................. B32B 31/00
[52] U.S. Cl. ..................................... 156/248; 156/235; 156/249; 156/268; 156/277; 156/289; 156/302; 156/315; 156/344; 252/511; 252/512; 427/208.2; 428/40; 428/202; 428/206; 428/352

[56] References Cited

U.S. PATENT DOCUMENTS

| | | | |
|---|---|---|---|
| 2,808,352 | 10/1957 | Coleman et al. | 252/511 |
| 2,970,730 | 2/1961 | Schwarz | 225/2 |
| 3,461,537 | 8/1969 | Lotz | 29/583 |
| 3,464,883 | 9/1969 | Moline et al. | 428/352 |
| 3,497,948 | 3/1970 | Wiesler et al. | 29/583 |
| 3,600,246 | 8/1971 | Breen | 156/330 |
| 3,741,786 | 6/1973 | Torrey | 428/202 |
| 3,871,936 | 3/1975 | Boyer et al. | 156/302 |
| 4,138,304 | 2/1979 | Gantley | 156/268 |
| 4,285,433 | 8/1981 | Garrett, Sr. | 209/573 |
| 4,440,830 | 4/1984 | Wempe | 428/352 |
| 4,606,962 | 8/1986 | Reylek et al. | 428/148 |

FOREIGN PATENT DOCUMENTS 7713911 6/1979 Netherlands ............... 156/249

OTHER PUBLICATIONS

Japanese Kokai No. 58/112,335, Jublished Jul. 4, 1983, (abstracted in Chem. Abstr., 100, 35502a, (1984).
"Module cover Sealing", by P. W. Schuessler, IBM Technical Disclosure Bulletin, vol. 18, No. 6, p. 1796 (Nov. 1975).
Patents Abstract of Japan, vol. 6, No. 144 (E-122) [1022], Aug. 3, 1982.
Patents Abstract of Japan, vol. 6, No. 247 (E-146). [1125], Dec. 7, 1982.

*Primary Examiner*—John J. Gallagher
*Attorney, Agent, or Firm*—Royal N. Ronning, Jr.

[57] ABSTRACT

A dicing film to support semiconductor wafers as they are diced into individual chips comprises a support film (e.g., of thermoplastic polymer), a release layer on one side of the film, and a pattern of conductive adhesive attached to the release layer for bonding to the wafer or wafers. The release layer allows for separation of the chip/conductive adhesive combination from the support film. Preferably, the adhesive is covered by a removable release liner prior to mating of the wafer and adhesive.

17 Claims, 2 Drawing Sheets

CARRIER FILM WITH CONDUCTIVE ADHESIVE FOR DICING OF SEMICONDUCTOR WAFERS AND DICING METHOD EMPLOYING SAME

This is a continuation application of U.S. Ser. No. 697,424, filed Feb. 1, 1985, now abandoned, which was a continuation application of U.S. Ser. No. 519,936, filed Aug. 3, 1983, also now abandoned.

BACKGROUND OF THE INVENTION

1. Field of the Invention

The present invention relates to a product which is useful in the fabrication of semiconductor chips

2. Description of Related Developments

Currently, silicon wafers with multiple printed circuitry are diced (or sawed) into individual circuits (chips) by first placing the wafer onto a dicing film (a polymeric support film having a tacky surface which holds the wafer in place during the dicing operation. The wafer is then partially cut through its thickness by a dicing implement (e.g., a diamond-impregnated wheel). The wafer is then cracked into individual chips during a cracking procedure, and the chips are separated by stretching the support film. The chips are then picked up individually by a vacuum chuck to be placed into an appropriate chip carrier. A drop of conductive adhesive is placed onto the chip carrier where the chip is to be placed. The adhesive is then cured to secure the chip into place and provide a ground for the chip during the step in which wires are bonded to the chip.

It has also been suggested that both cost reduction and yield improvement can be achieved in the actual fabrication of the semiconductor products by elimination of the application of conductive adhesive to the chip carrier. This could be accomplished by applying conductive adhesive to the dicing film itself so that the adhesive and chip are attached to one another prior to the dicing step. During dicing the adhesive would hold the wafer on the support film. The dicing implement would cut through the entire thickness of the wafer, through the adhesive and only partially into the carrier film itself in order to still provide the needed support for the wafer. After dicing, the chips would be picked from the carrier film along with the conductive adhesive and would be placed onto the chip carrier. The adhesive would then be cured at the appropriate temperatures to develop the chip/carrier bond and the desired conductivity.

Although such a conductive adhesive/dicing film combination represents a theoretical improvement over the use of a dicing film having a mere surface tackiness, problems have been encountered in cleanly removing the wafer/adhesive combination from the support film after the wafer and adhesive have been brought into contact with one another.

SUMMARY OF THE PRESENT INVENTION

The present invention relates to an improved conductive adhesive/dicing film product which has a release layer between the conductive adhesive and the film which supports it. The use of the release layer facilitates easy removal of the adhesive with the attached chip, without destroying the integrity of the adhesive, and overcomes a serious problem noted with the conductive adhesive/dicing film product suggested by the prior art. In a preferred embodiment, the exposed surface of the adhesive is also covered with a suitable release liner to prevent contamination and/or injury to the adhesive.

DESCRIPTION OF THE DRAWINGS

The present invention is further illustrated by the Drawings, which form a portion of the present specification, wherein.

DETAILED DESCRIPTION OF THE PRESENT INVENTION

Figure 1:
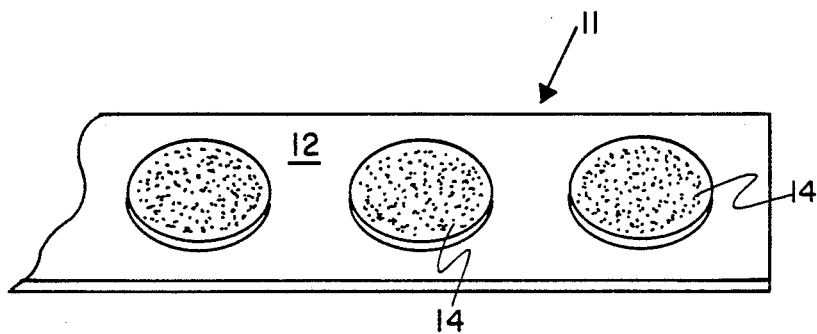
FIG. 1 is a perspective view showing the dicing film and its adherent conductive adhesive patterns for contact with the printed wafer.
Figure 2:
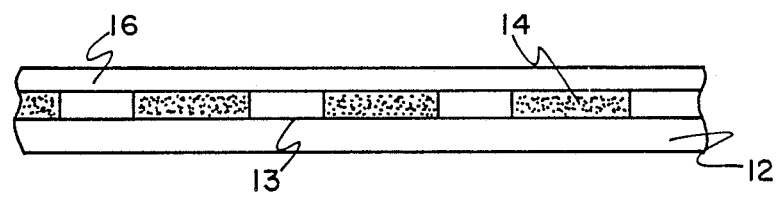
FIG. 2 is an enlarged cross-sectional view of a section of the preferred embodiment of the dicing film of the present invention.
Figure 3:
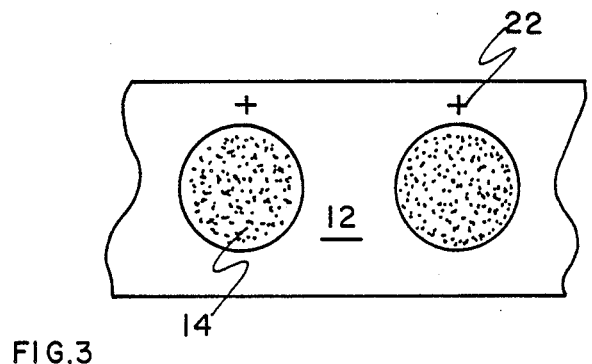
FIG. 3 is an overhead view of a dicing film embodiment in accordance with the present invention.

The dicing film 11 of the present invention comprises a support film 12, an adherent release layer 13, and, attached to the release layer, a suitable pattern of conductive adhesive 14 to receive semiconductor wafers 15 for later dicing (not shown). The carrier film 12 needs to have sufficient support for the selected adhesive patterns while allowing such operations as oven drying. It needs to provide support, for example, for the cut chip after the dicing operation. The release layer 13 must allow for pick-up of the conductive adhesive/chip combination after the dicing operation without causing injury to the adhesive. The conductive adhesive 14 must have a sufficient level of conductivity, should have good smoothness to allow for full surface contact between it and the wafer and needs to be either dried or partially cured to a suitably tacky state and held in such a state for use at the wafer attachment stage. It needs to have a sufficient degree of cohesiveness to allow for its stripping from the support film without destruction of its physical integrity and also to allow stripping of an optional cover film therefrom. The conductive adhesive should have a suitable degree of thickness, e.g., from about 0.25 to about 1.5 mils to impart proper electrical requirements for grounding of the adhesive mounted chip to the ground plane. The present invention enables one to place the chip/adhesive combination in a chip carrier such that the adhesive supports the chip but does not cover any substantial area outside its support area. This allows for a more compact configuration for the necessary wires bonding the chip to the carrier, without increasing the possibility of short circuits arising due to close proximity of wire and conductive adhesive.

Representative support films which can be used in the dicing film product 11 of the present invention include paper as well as those made from such well known thermoplastic polymers as olefin polymers (e.g., polyethylene or polypropylene), vinyl halide polymers, and polyester. The thickness of the support film can range from about 1 to about 6 mils, with a thickness of 3-6 mils being preferred. Films having the preferred, greater thicknesses of 3-6 mils allow for a somewhat greater degree of safety in view of possible variation in the actual manufacturing tolerances in the dicing operation. An excessively thin film, if cut entirely through due to inherent variations in the manufacturing process, would not provide the needed support for the wafer.

Coated on one side of the support film is a suitable release layer 13 which, as will be mentioned below, allows for easy separation of the conductive adhesive/chip combination from the support film 12 after dicing. The release layer chosen for the product must be "tight" enough to allow for an acceptable degree of bonding of the conductive adhesive during the attachment and dicing operations. It must nevertheless be "light" enough to allow for release of the chip/adhesive combination after the dicing step without causing damage to the adhesive which must be reapplied to the chip carrier. Representative release layers can comprise silicone and fluorocarbon compositions such as those described in the prior art (e.g., in U.S. Pat. Nos. 3,912,569 and 3,575,917 to A. M. Kapral). These release layers need only be thick enough to confer the desired release properties (e.g., from about 0.5 lb. to about 2 lbs. per ream). If the surface of the support film has an inherent release layer function (polyfluorocarbon), the inherent release characteristics of its surface can be utilized in accordance with the present invention as the "release layer". A commercial source of suitable silicone release coated polymeric film (e.g., polypropylene with SILOX brand release coating) is Akrosil Corporation of Menasha, Wisconsin.

Attached to the exposed surface of the release layer is a suitable pattern of conductive adhesive 14 to form a point of attachment for the semiconductor wafers 15 that are to be diced. Generally, the conductive adhesive pattern can comprise a series of circular adhesive patterns of a suitable size (e.g., 1-6 inches) to approximate the diameter of the wafer to be mounted thereon. The thickness of the adhesive can range from about 0.2 mil to about 1.5 mils. Suitable conductive adhesive compositions which can be utilized include those adhesive materials which are loaded with fillers to effect conductivity requirements (e.g., 2% to about 75%, by weight of a suitable conductive material). Representative conductive materials include finely divided conductive metals (e.g., aluminum, copper, silver, gold, palladium), or carbon black. Representative adhesive materials which can form a matrix for the conductive materials include polyimide, acrylic, epoxy, silicones, and various modified polymeric materials to meet desired thermal and conductivity requirements.

In a preferred embodiment, the dicing film product 11 of the present invention also includes a suitable release liner 16 over the exposed surface of the adhesive to protect it from contamination and/or damage (e.g., inadvertent destruction of the preferred, substantially flat upper surface). For example, release coated paper can be employed as the release liner material. The release liner can have a differing release characteristic than the release layer.

Figure 4:
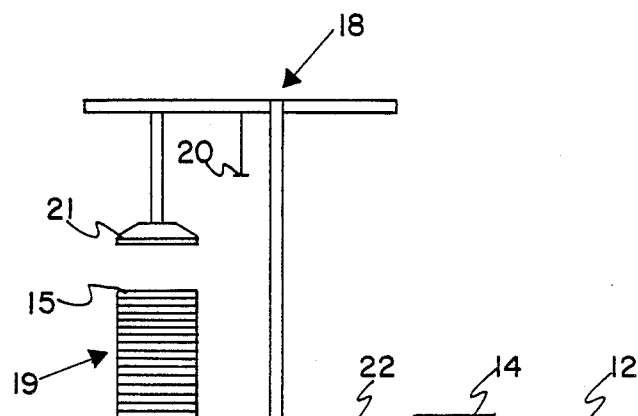
FIG. 4 shows an embodiment in which a wafer is about to be picked up for transfer to the dicing film.
Figure 5:
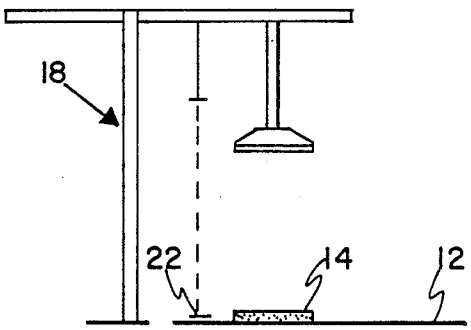
FIG. 5 illustrates alignment of the wafer and adhesive pattern preparatory to attachment of wafer and adhesive.
Figure 6:
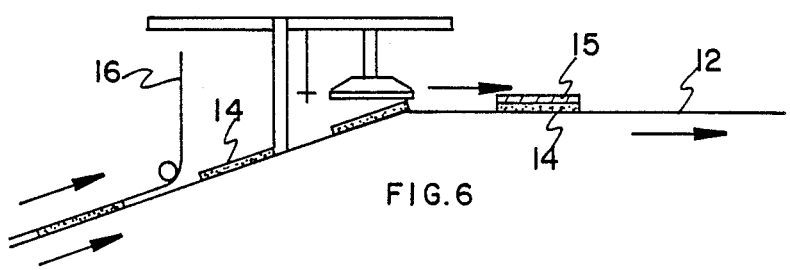
FIG. 6 shows the wafer/adhesive attachment procedure.

FIGS. 4-6 illustrate a manner in which the dicing film of the present invention can be used. FIG. 4 shows a pivotal vacuum plate assembly about to pick up a semiconductor wafer from an array 19 of stacked wafers 15. FIG. 5 illustrates the configuration of an electric eye 20 guided vacuum plate 21 in aligning wafer and adhesive in response to the registration mark 22 on the film 12. FIG. 6 illustrates the wafer attachment step and also illustrates the prior stripping of the release liner 16 from the conductive adhesive 14/dicing film 12 combination.

The dicing film of the present invention can be formed using conventional lamination and printing operations. The release layer can, for example, be coated onto the support film by using conventional coating techniques followed by drying of the layer. The pattern of conductive adhesive is then applied to a dried release layer surface by appropriate printing procedures (e.g., rotary or flat bed screen printing) and then the adhesive is transferred to the support film 12 by lamination. If a release liner is desired over the exposed surface of the adhesive, it can also be applied by conventional lamination procedures.

The present invention is further illustrated by the Examples which follow.

EXAMPLES 1-6

The general procedure used to form all the samples involved screen printing of a suitable adhesive pattern (i.e., a succession of circles having a diameter of 3-4 inches and a thickness of about 1 mil) onto release coated paper. The release coated paper was 42 # weight semi-bleached kraft paper. The adhesive was a silver modified polyimide (P-1011 brand from Epoxy Technology, Inc.). The resulting laminate was then oven dried for 30 minutes at 153° F.

The laminate made by the foregoing procedure was passed through a pressure nip with the selected support film such that the adhesive pattern faced the support film to laminate the adhesive pattern thereto. Sufficient pressure was used to effect such transfer. When the adhesive pattern had been transferred to the support film, the resulting laminate was heated for five minutes at 153° F. to dry the newly exposed side of the adhesive.

In these Examples a number of polypropylene support films were chosen for use. The film chosen for use in Example 1, as the control, was 5.0 mil polypropylene from Hercules and contained no release coating. In Examples 2-6 silicone release coated polypropylene from Akrosil Corporation was used having a thickness of 1-3 mils as described below:

| Example | Thickness (mils) | Relative Lightness/Tightness* |
| --- | --- | --- |
| 2 | 3 | 4 |
| 3 | 2 | 8 |
| 4 | 1 | 8 |
| 5 | 3 | 3 |
| 6 | 3 | 2 |

*the relative lightness/tightness gives a rough estimate of how light or tight the release is. The lightest release is given a "1"; the tightest, a "10".

After the adhesive pattern has been transferred to the support films, the same type of paper originally used in the screen printing of the adhesive was used as a cover sheet for the exposed surface of the adhesive pattern. This cover sheet was fed with the adhesive/support film laminate through two pressure nips so that the release coating and exposed surface of the adhesive pattern were brought together under sufficient pressure to bond the release paper and laminate. Alternatively, a thin polyester film or other suitable release coated polyolefin (e.g., about 1 mil in thickness) can be used as the cover sheet.

EXAMPLES 7-12

Each of the laminates made in Examples 1-6 was tested (after removal of the cover sheet) to determine if the adhesive separated readily from the support film.

The following procedure was used. A silicon wafer was affixed to the adhesive by action of a squeegee to eliminate air entrapment. After attachment had been completed, an attempt was made by hand to remove the wafer and its attached adhesive cleanly from the support film.

The results obtained are as follows:

| Film Made by Example | Results |
| --- | --- |
| 1 (Control) | Adhesive stuck to support film with only a small amount attached to the wafer. |
| 2 | Very good transfer to wafer with slight sticking of adhesive to support film. |
| 3 | Poor transfer to wafer due to tightness of release layer. |
| 4 | Poor transfer to wafer due to tightness of release layer. |
| 5 | Fair to good transfer to wafer. |
| 6 | Excellent transfer to wafer. |

The foregoing Examples should not be construed in a limiting sense since they only illustrate certain preferred embodiments of the present invention. The scope of protection sought is set forth in the claims which follow.

What is claimed is:

1. A dicing film to support semiconductor wafers when they are diced into individual chips which comprises:
   (a) a support film;
   (b) a release layer on one side of the support film; and
   (c) a pattern of curable, semiconductor chip bonding, conductive adhesive releasably affixed to the release layer on said support film, the adhesive pattern being of a size and shape to support at least one semiconductor wafer therein, the release layer allowing for pick-up of a semiconductor chip from the support film with adherent conductive adhesive without any substantial destruction of the physical integrity of the adherent adhesive.

2. A film as claimed in claim 1 in which the support film is formed of a polyolefin polymer.

3. A film as claimed in claim 1 wherein the support film is polypropylene.

4. A film as claimed in claim 1 wherein the support film has a thickness of from about 1 mil to about 6 mils.

5. A film as claimed in claim 1 wherein the release layer comprises a silicone composition.

6. A film as claimed in claim 1 wherein the release layer comprises a fluorocarbon composition.

7. A film as claimed in claim 1 wherein the conductive adhesive has a thickness of from about 0.2 mil to about 1.5 mils.

8. A film as claimed in claim 1 wherein the conductive adhesive contains an effective amount for conductivity of a conductive metal in an adhesive matrix.

9. A film as claimed in claim 2 wherein the support film has a thickness of from about 1 mil to about 6 mils.

10. A film as claimed in claim 9 having a release layer which comprises a silicone composition.

11. A film as claimed in claim 10 having a conductive adhesive of a thickness of from about 0.2 mil to about 1.5 mils and wherein the adhesive contains an effective amount for conductivity of a conductive metal in an adhesive matrix.

12. A film as claimed in claim 1 which also has a release liner over the pattern of conductive adhesive.

13. A film as claimed in claim 11 which also has a release liner over the pattern of conductive adhesive.

14. A process for forming individual chips from a semiconductor wafer which comprises:
   (a) attaching the wafer to the adhesive pattern carried by the dicing film of any of claims 1–11; and
   (b) dicing the wafer to form said chips.

15. A process as claimed in claim 14 wherein the wafer is placed on the adhesive by a vacuum plate assembly.

16. A process as claimed in claim 15 wherein the vacuum plate assembly is guided by means of a registration mark on the dicing film.

17. A process as claimed in claim 14 wherein the process also comprises removal of the chip from the film with placement in a chip carrier.

* * * * *

UNITED STATES PATENT AND TRADEMARK OFFICE
CERTIFICATE OF CORRECTION

PATENT NO. : 4,961,804

DATED : October 9, 1990

INVENTOR(S) : Joseph A. Aurichio

It is certified that error appears in the above-identified patent and that said Letters Patent is hereby corrected as shown below:

On the title page, in item [73] Assignee, insert --National Starch and Chemical-- immediately before "Investment".

Signed and Sealed this

Ninth Day of June, 1992

Attest:

Attesting Officer

DOUGLAS B. COMER

Acting Commissioner of Patents and Trademarks